(12) United States Patent
Sun et al.

(10) Patent No.: US 11,175,448 B2
(45) Date of Patent: Nov. 16, 2021

(54) LIGHT-EMITTING DEVICE AND METHOD FOR FABRICATING SAME

(71) Applicant: DURA-CHIP (NANTONG) LIMITED, Nantong (CN)

(72) Inventors: Zhijiang Sun, Nantong (CN); Shuchang Wang, Nantong (CN); Shuai Chen, Nantong (CN)

(73) Assignee: DURA-CHIP (NANTONG) LIMITED, Nantong (CN)

( * ) Notice: Subject to any disclaimer, the term of this patent is extended or adjusted under 35 U.S.C. 154(b) by 0 days.

(21) Appl. No.: 17/166,276

(22) Filed: Feb. 3, 2021

(65) Prior Publication Data
US 2021/0208330 A1 Jul. 8, 2021

Related U.S. Application Data

(63) Continuation of application No. PCT/CN2019/099068, filed on Aug. 2, 2019.

(30) Foreign Application Priority Data

Aug. 3, 2018 (CN) .......................... 201821244963.6
Sep. 14, 2018 (CN) .......................... 201811076034.3
(Continued)

(51) Int. Cl.
*F21V 8/00* (2006.01)
*G02F 1/1335* (2006.01)
(Continued)

(52) U.S. Cl.
CPC ......... *G02B 6/0073* (2013.01); *G02B 6/0051* (2013.01); *G02F 1/133514* (2013.01);
(Continued)

(58) Field of Classification Search
CPC ................ G02B 6/0073; G02B 6/0051; G02F 1/133514; G02F 1/133621; H01L 21/6835;
(Continued)

(56) References Cited

U.S. PATENT DOCUMENTS

| 3,877,052 A | * | 4/1975 | Dixon | ..................... H01L 33/46 |
| | | | | 257/95 |
| 2012/0206923 A1 | * | 8/2012 | Tanaka | ................. G02B 5/0247 |
| | | | | 362/326 |
| 2020/0064687 A1 | * | 2/2020 | Imada | ............... G02F 1/133504 |

FOREIGN PATENT DOCUMENTS

| CN | 106773315 A | 5/2017 |
| CN | 106932951 A | 7/2017 |
(Continued)

OTHER PUBLICATIONS

International Search Report of PCT/CN2019/099068.

*Primary Examiner* — Mary Ellen Bowman (57) ABSTRACT

The present disclosure provides a light emitting device and a method for fabricating the same. The light emitting device comprises: a substrate; a plurality of LED light sources, wherein the LED light source adopts a package form emitting light from four sides and having a reflection layer on a top surface, and the plurality of LED light sources are disposed on the substrate at intervals; and a transparent dielectric layer being disposed at a surface of the substrate and covering the plurality of LED light sources. The invention can be used to improve light-mixing effects.

20 Claims, 8 Drawing Sheets

(30) Foreign Application Priority Data

Sep. 14, 2018 (CN) .......................... 201811076041.3
Nov. 9, 2018 (CN) .......................... 201811330817.X (51) Int. Cl.
| | | |
|---|---|---|
| *G02F 1/13357* | (2006.01) | |
| *H01L 21/683* | (2006.01) | |
| *H01L 25/075* | (2006.01) | |
| *H01L 33/00* | (2010.01) | |
| *H01L 33/32* | (2010.01) | |
| *H01L 33/46* | (2010.01) | |
| *H01L 33/50* | (2010.01) | |
| *H01L 33/56* | (2010.01) | |

(52) U.S. Cl.
CPC .... *G02F 1/133621* (2013.01); *H01L 21/6835* (2013.01); *H01L 25/0753* (2013.01); *H01L 33/0095* (2013.01); *H01L 33/32* (2013.01); *H01L 33/46* (2013.01); *H01L 33/507* (2013.01); *H01L 33/56* (2013.01); *H01L 2221/68354* (2013.01); *H01L 2221/68368* (2013.01); *H01L 2221/68386* (2013.01); *H01L 2933/005* (2013.01); *H01L 2933/0025* (2013.01); *H01L 2933/0091* (2013.01)

(58) Field of Classification Search
CPC . H01L 25/0753; H01L 33/0095; H01L 33/32; H01L 33/46; H01L 33/507; H01L 33/56
See application file for complete search history.

(56) References Cited

FOREIGN PATENT DOCUMENTS

| | | | |
|---|---|---|---|
| CN | 207664057 U | | 7/2017 |
| CN | 207664057 U | * | 7/2018 |
| CN | 109828410 A | | 5/2019 |
| CN | 110176448 A | | 8/2019 |
| CN | 209325466 U | | 8/2019 |
| CN | 209325530 U | | 8/2019 |
| CN | 209325692 U | | 8/2019 |
| CN | 106773315 B | * | 5/2020 |

* cited by examiner

LIGHT-EMITTING DEVICE AND METHOD FOR FABRICATING SAME

CROSS REFERENCE TO RELATED APPLICATIONS

This application is a continuation of PCT patent application PCT/CN2019/099068 filed on Aug. 2, 2019, which claims all benefits accruing from China Patent Application Nos. 201811330817.X, filed on Nov. 9, 2018, 201811076034.3, filed on Sep. 14, 2018, 201811076041.3, filed on Sep. 14, 2018, and 201821244963.6, filed on Aug. 3, 2018, in the China National Intellectual Property Administration, the content of which is hereby incorporated by reference.

TECHNICAL FIELD

The present disclosure relates to semiconductor, and in particular, to light emitting device and a method for preparing the same.

BACKGROUND

At present, a conventional surface light source display module with direct-type mainly is prepared by the following three methods:

a first method, disposing a diffuser plate at a position that has a certain distance above the LED light source array, so as to turn a point light source into a surface light source with the diffuser plate;

a second method, installing a lens close to the LED light source, so that the light emitted by the LED light source is transmitted through the lens and air layer and then irradiated on the diffuser plate, and then the point light source becomes a surface light source; and a third method directly coating silica gel and fluorescent powder on the LED light source array to define a light-guide medium layer, thereby turning the point light source into a surface light source.

The light emitting angle of the conventional LED light source is limited, for example, the maximum light emitting angle of the LED light source can be 120 degrees. When using the first and the second method, it is easy to form a dark area, and the light mixing is non-uniform. When using the third method, the light emitted by the LED light source is not conducive to lateral propagation in the fluorescent powder-containing layer, and the lateral propagation effect is limited.

Therefore, it is urgent to develop a light emitting device that can improve the light mixing effect and avoid uneven brightness.

SUMMARY

The present disclosure mainly provides a light emitting device and a method for preparing the same, which can improve a light-mixing effect.

In order to solve the technical problem, the present disclosure provides a light emitting device including: a substrate; a plurality of LED light sources disposed on the substrate at intervals, wherein each of the plurality of LED light source has a first reflecting layer on a top surface of each of the plurality of LED light source and light is able to emit from four sides of each of the plurality of LED light source; and a transparent dielectric layer, which is disposed on a first surface of the substrate and covers the plurality of LED light sources.

In order to solve the technical problem, the present disclosure further provides a method for preparing the light emitting device, including: placing a plurality of LED light sources on a substrate, wherein each of the plurality of LED light sources includes a first reflecting layer on a top surface of each of the plurality of LED light sources and light is able to emits from four sides of each of the plurality of LED light sources; disposing the substrate on a supporting base, wherein a second surface of the substrate without the plurality of the LED light sources is in contact with the supporting base; forming the transparent dielectric layer on the supporting base, wherein the transparent dielectric layer covers the plurality of the LED light sources; and peeling off a light emitting device from the supporting base.

The present disclosure includes the following advantages. Compared with the conventional art, the LED light source has a first reflecting layer on a top surface and light emits from four sides of the LED light source. The first reflecting layer on the top surface of the LED light source can reflect part of light to side surfaces of the LED light source, so as to increase the light emitting angle of the LED light source and increase light mixing effect. At the same time, the LED light sources are equidistantly arranged in the transparent dielectric layer, so that the light can be diffused more evenly, and the light of each LED light source can transmit and couple in the transparent dielectric layer.

DETAILED DESCRIPTION

Figure 10:
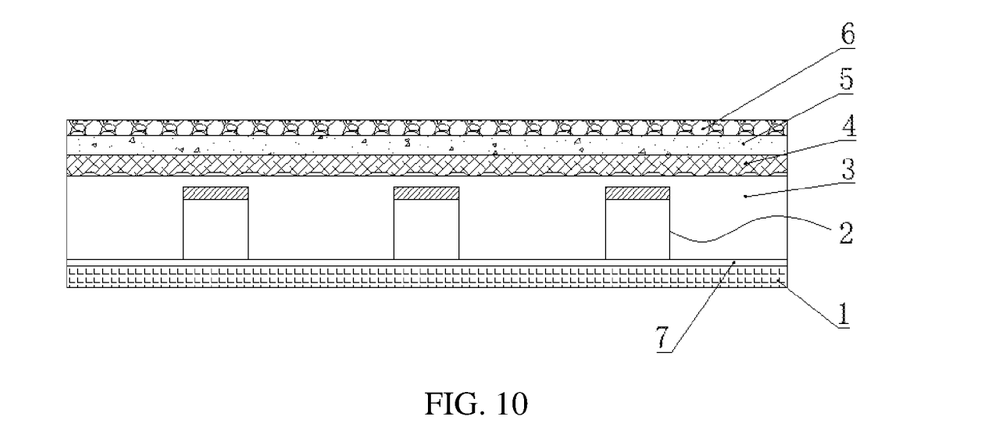
FIG. 10 is a structural schematic diagram of the light emitting device in an embodiment of the present disclosure.

Referring to FIG. 10, FIG. 10 is a structural schematic diagram of the light emitting device in an embodiment of the present disclosure. The light emitting device can include a substrate 1, a plurality of LED light sources 2 and a transparent dielectric layer 3. The plurality of LED light sources 2 can be disposed on the substrate at intervals; and have a first reflecting layer on a top surface of the light source and can emit light from four sides of the LED light source 2. The transparent dielectric layer 3 can be disposed on a first surface of the substrate and cover the plurality of LED light sources 2. The transparent dielectric layer 3 can have a thickness larger than or equal to a thickness of the top surface of the LED light source 2. In the present disclosure, the substrate 1 can be an integrated substrate, or can be a plurality of discontinuous strip-shaped plate disposed at intervals, and the LED light source 2 is disposed on the discontinuous strip-shaped plate.

Figure 11:
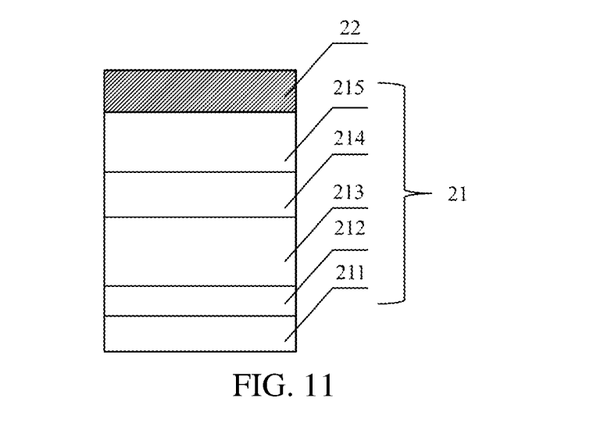
FIG. 11 is a structural schematic diagram of an LED light source of the light emitting device in FIG. 10.

In some embodiments, the LED light source 2 can be a purple light source, a blue light source, a red light source, a green light source, etc. Referring to FIG. 11, the LED light source 2 can include an LED chip body 21 and the first reflecting layer 22 covering on a top surface of the LED chip body 21. An area of the first reflecting layer 22 can be equal to the area of the top surface of the LED chip body 21. The first reflecting layer 22 can be a DBR-distributed Bragg reflector or a metal reflecting layer.

Figure 13:
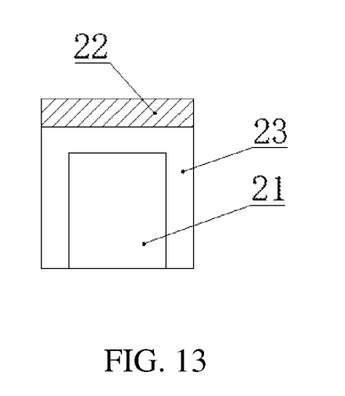
FIG. 13 is a structural schematic diagram of an LED light source of the light emitting device in FIG. 12.
Figure 15:
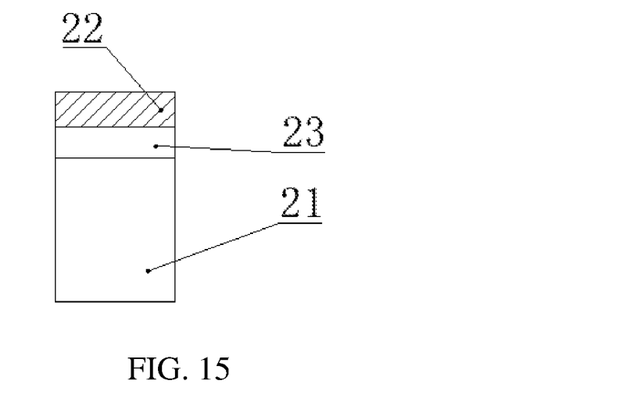
FIG. 15 is a structural schematic diagram of another LED light source of the light emitting device in FIG. 12.

In some embodiments, referring to FIG. 13, the LED light source can further have a first medium layer 23, which can be located on the top surface and side surfaces of the LED chip body 21, and the first reflecting layer can be located at a top surface of the first medium layer. A refractive index of the first medium layer 23 is larger than or equal to a refractive index of the transparent dielectric layer 3. In other embodiments, referring to FIG. 15, the first medium layer 23 can be independently disposed on the top surface of the LED chip body 32, without covering the side surfaces of the LED chip body 21. At this time, the first reflecting layer 22 can be located on the top surface of the first medium layer 23.

Figure 1:
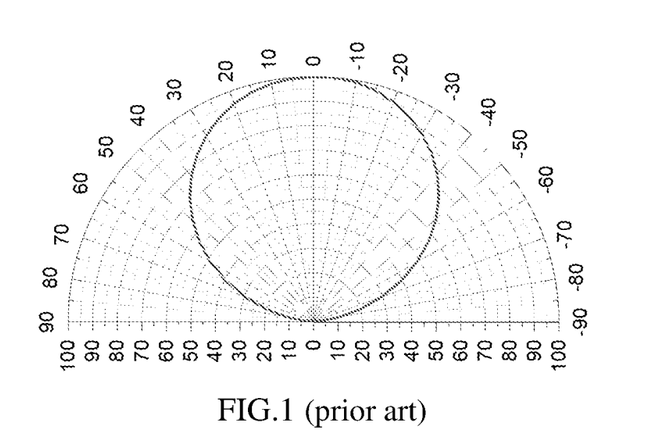
FIG. 1 is a test pattern of a light emitting angle of a conventional LED light source.
Figure 14:
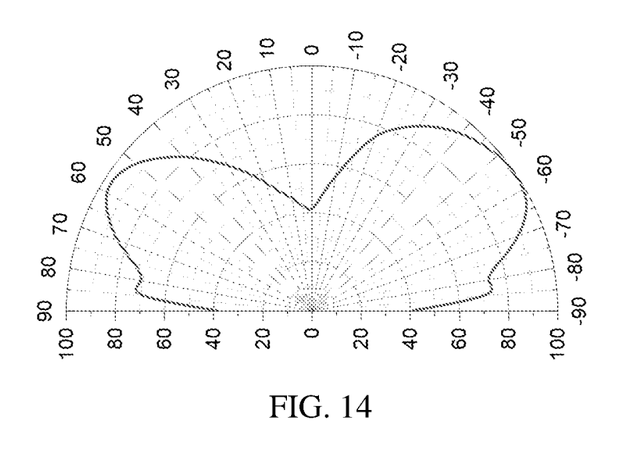
FIG. 14 is a test pattern of a light emitting angle of the LED light source in FIG. 13.

Taking an LED light source 2 including the first reflective layer 22 made of a translucent and semi-reflective material and located on a top surface of the LED light source 2 as an example, as shown in FIG. 14, a main energy angle of a main light emitting direction of the LED light source with a normal Lambertian light type structure can transition from 0 degree to positive and negative 60 degrees. Furthermore, it can be seen from the light intensity distribution that, the light emitting light intensity is uniformly distributed throughout the light emission angle successfully, and the light intensity of light emitting of the LED light source in a range of positive and negative 85 degrees is about 73% of the light intensity peak. However, in the conventional LED light source with a normal Lambertian light type structure, if its light emitting angle is 120 degrees, i.e. its light emission intensity in a range of positive and negative 60 degrees is only half of the light intensity peak (as shown in FIG. 1). In the present embodiment, the light emitting light intensity of the LED light source in a range of positive and negative 85 degrees is about 73% of the light intensity peak.

Figure 16:
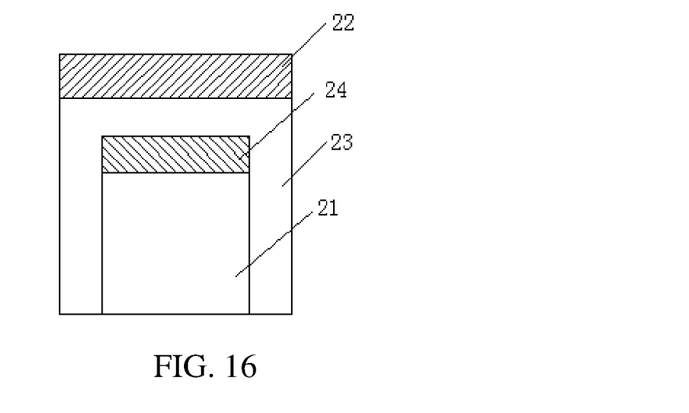
FIG. 16 is a structural schematic diagram of another LED light source of the light emitting device in FIG. 12.
Figure 17:
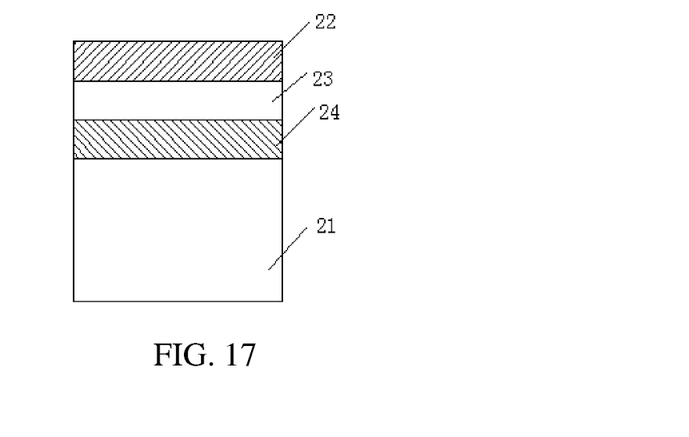
FIG. 17 is a structural schematic diagram of another LED light source of the light emitting device in FIG. 12.

In some embodiments, referring to FIG. 16 and FIG. 17, the LED light source can further have a second reflecting layer 24, which can be located between the top surface of the LED chip body 21 and the first medium layer 23, and the second reflecting layer is a totally reflecting layer or a partially reflecting layer.

In some embodiments, the transparent dielectric layer 3 can be a medium layer consisting of a homogeneous medium without fluorescent powder, and the homogeneous medium is uniformly disposed. The transparent dielectric layer 3 can be prepared by methods of mould pressing, dispensing, spraying or growing. A material of the transparent dielectric layer 3 can be transparent having a high refractive index, such as silica gel, acrylic, PC, PS, and etc.

In order to solve the problem of uneven light intensity and improve the light-mixing effect, referring to FIG. 10, a first microstructure layer can be located on an upper surface of the substrate 1 (i.e., a first surface of the substrate near the transparent dielectric layer 3); and/or, located on a lower surface of the transparent dielectric layer 3 (i.e., a first surface of the transparent dielectric layer near the substrate 1), and/or located on an upper surface of the transparent dielectric layer 3 (i.e., a second surface of the transparent dielectric layer away from the substrate 1). The first microstructure layer is generally provided with a dark region of an LED light source 2 distributed in an array.

The light emitting device can further include a waveguide reflecting layer, which can be located between the first surface of the first medium layer and the substrate.

Specifically, the light emitting device can be used as surface light sources of backlight display and lighting industry, such as an ultra-thin display, a panel lamp (with frame and without frame), a bulb lamp, a filament lamp, a daylight lamp, and a street lamp. The LED light source 2 can be a blue light source. The transparent dielectric layer 3 can be a blue-light waveguide layer, which is a blue-light waveguide layer having a high refractive index. Alternatively, the LED light source 2 can be a purple light source.

The conventional surface light source will be illustrated hereinafter.

In recent years, among the surface light sources used in the backlight display and lighting industries, the hack light unit (HLU: Hack Light Unit) includes two types: direct-type and side-type. Among them, the side-type surface light source has the following advantages: the overall thickness is relatively thin, and the number of light sources is small. The disadvantages of the side-type surface light source are: a light-guide plate is needed; high cost; lower light conversion efficiency than the direct type; local dimming cannot be achieved in the display field, and it thus cannot achieve high dynamic range (HDR), and its HDR is generally 3000:1, which greatly limits the use thereof. In the direct type surface light source, the LED array is placed at the bottom of the surface light emitting module, and the light emitted from the LED is reflected by the bottom surface and the side surface of the surface light emitting module, and then uniformly emitted through the surface diffuser plate and the optical module. Due to the simple process, the direct-type surface light source can be provided without a light-guide plate, has high light conversion efficiency and low cost, and occupies a certain low-end market in the lighting and display field. Currently, in order to obtain a more vivid color display effect, a higher ratio of the actual brightness difference is required (i.e.: the ratio of the brightness of the brightest object to the brightness of the darkest object), i.e., high dynamic range (HDR). As HDR of direct-type backlight unit can reach 20000:1, it has gradually received attention in the application of surface light source in the backlight display and lighting industry.

Currently, a conventional surface light source display module with direct-type is prepared by the following three methods.

A first method is arranging a diffusion plate above an LED light source array with a certain distance. So that the point light source is changed to a surface light source by the diffusion plate.

A second method is attaching a lens adjacent to the LED light source. So that the light emitted from the LED light source is transmitted to the diffusion plate through the lens and the air layer, and then the point light source is changed into a surface light source.

A third method is mixing silica gel and phosphor and directly coating on the LED light source array to form a light guide dielectric layer. So that the point light source is changed to a surface light source There are some disadvantages or limitations in the above three methods.

Figure 2:
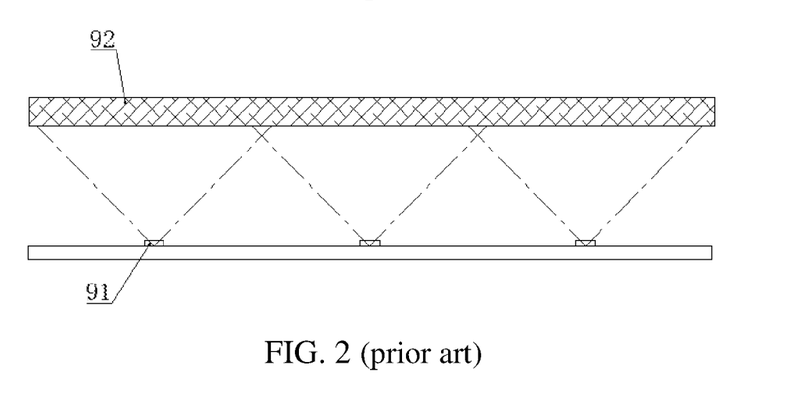
FIG. 2 is a schematic diagram illustrating light intensity superposition principle of a conventional direct-type surface light source display module prepared by the first method.

Specifically, disadvantages of the first method are as follows. Referring to FIG. 1 and FIG. 2, the light emitting angle of the conventional LED light source only reaches a maximum of 120 degrees. A distance between a LED light source 91 and a diffusion plate 92 should be large enough so as to achieve a relatively uniform light mixing effect. So a thickness of the whole surface light source display module is generally great, thereby limiting the whole surface light source display module to apply to the lighting industry, such as a panel lamp. Its application is very limited.

Figure 3:
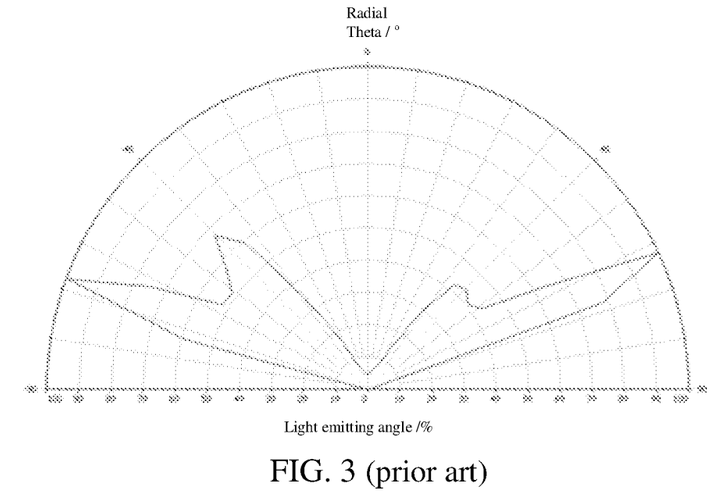
FIG. 3 is a diagram illustrating the light emitting angle of another conventional LED light source with addition of a lens in prior art.
Figure 4:
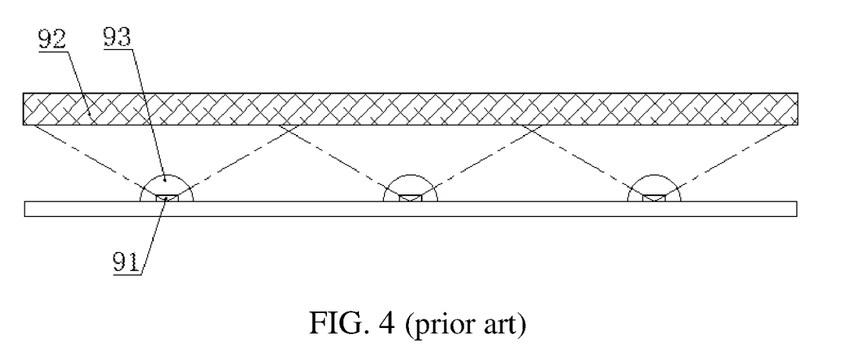
FIG. 4 is a schematic diagram illustrating light intensity superposition principle of another conventional direct-type surface light source display module having LED light source with addition of a lens in prior art.

Disadvantages of the second method are as follows. Referring to FIG. 3 and FIG. 4, the light emitting angle of a conventional LED light source 91 with the addition of the lens 93 can reach 135 degrees. Although the light emission angle is increased, the light emitting from a top surface of a diffusion plate 92 is greatly reduced. A relatively uniform light mixing effect can be achieved within a relatively shorter distance. Since the secondary optical lens needs to be used, the diffusion plate 92 and the lens 93 should be located with a certain distance. Compared with that of the whole surface light source display module in the first method, even if closely arranging LED light sources, the thickness of the whole surface light source display module is slightly reduced, but it cannot achieve an ultrathin effect.

Figure 7:
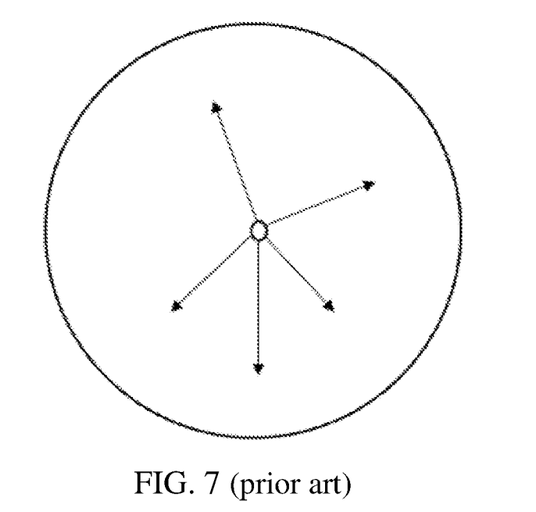
FIG. 7 is a schematic diagram illustrating loss of light intensity of a point light source including a fluorescent powder dielectric layer.
Figure 8:
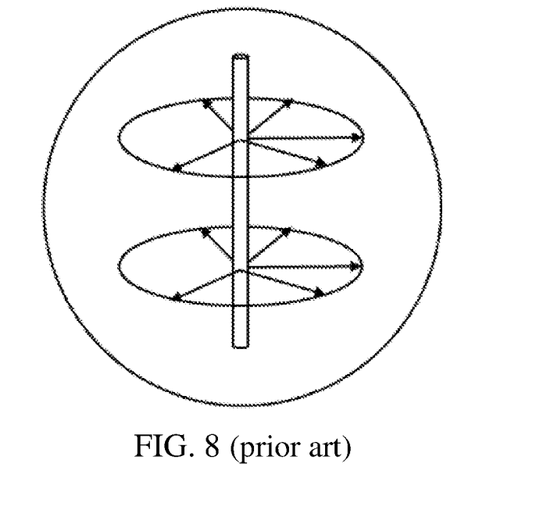
FIG. 8 is a schematic diagram illustrating loss of light intensity of a linear light source including a fluorescent powder dielectric layer.
Figure 9:
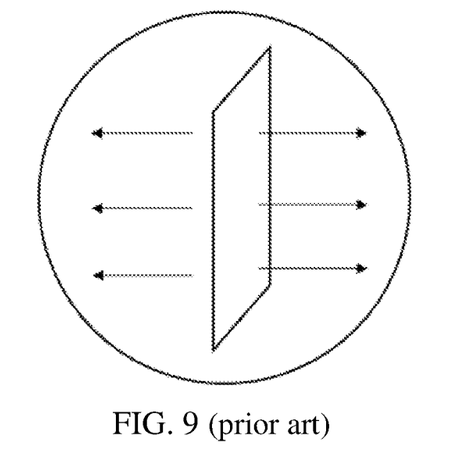
FIG. 9 is a schematic diagram illustrating loss of light intensity of a surface light source including a fluorescent powder dielectric layer.

Disadvantages of the third method are as follows. Referring to FIG. 8, a phosphor light guide dielectric layer 94 is coated on a surface of the light source array including the LED chips 91'. The lateral propagation and light mixing effect of white light may be slightly increased. However, it can be seen from optical theory that, when a blue light is transmitted in the phosphor light guide dielectric layer, the intensity of the blue light as the excitation light is rapidly decreased due to absorption and irregular scattering of the phosphor. Referring to FIG. 7, when light of a point light source is transmitted in the fluorescent powder-containing waveguide layer, the light intensity is numerically inversely proportional to cube of the distance. As shown in FIG. 8, when light of a linear light source is transmitted in the fluorescent powder-containing waveguide layer, the light intensity is numerically inversely proportional to square of the distance. As shown in FIG. 9, when light of the surface light source is transmitted in the fluorescent powder-containing waveguide layer, the light intensity is numerically inversely proportional to the distance.

Figure 5:
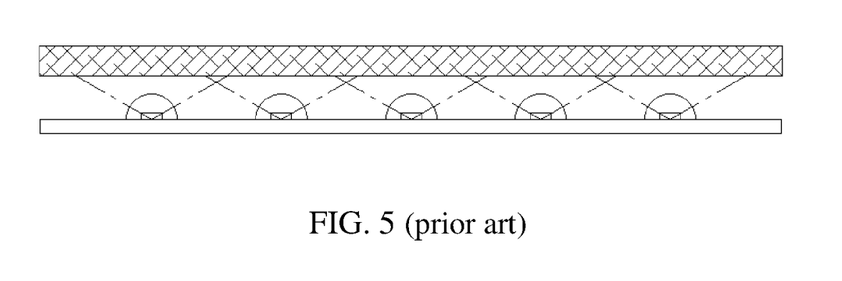
FIG. 5 is a schematic diagram illustrating light intensity superposition principle of another conventional direct-type surface light source display module including closely arranging LED light sources and lens.

In view of above, when a surface light source prepared by the first method or the second method is adopted, it is easy to form a dark area and there is a problem of poor uniformity of mixing the light. A thickness of the whole direct-type surface light source display module is great, which may be reduced only by reducing a distance between adjacent two LED light sources (referring to FIG. 5). However, this may make the number of LED light sources squared, increasing the cost greatly.

When the surface light source prepared by the third method is adopted, although the thickness of the surface light source display module can be decreased, the white light obtained by mixing a light excited by a blue light is severely attenuated in the phosphor light guide dielectric layer during the propagation process, and the light intensity of the blue light is lowered, and the transverse propagation intensity along a waveguide direction is lowered. The light emitting brightness of the LED chip is non-uniform, and the light mixing effect is poor, resulting in that the whole brightness of the surface light source is also less uniform.

When the light emitting device provided in the present application is used as a surface light source display module, the LED light source 2 has four light emitting side surfaces. At the same time, the LED light source 2 is uniformly distributed in an array in the blue-light waveguide layer (i.e., the transparent dielectric layer 3) having a high refractive index, and has a more even light distribution. Since the LED light source 2 is directly arranged in the high refractive index blue waveguide layer, each LED light source 2 the light of each LED light source can convey and couple in the transparent dielectric layer. But the conventional side-type light guide technology is incident on both sides of the light guide plate and then spreads laterally, the light source and the light guide plate are completely separated. In actual use, for example, in the process of manufacturing lamps, when the traditional side-type light guide technology is used, light sources should be additionally attached to the surface of the light guide plate, and the light source manufacturers are separated from the lamp manufacturers. When the light emitting device of the present disclosure is used, the light guide layer and the light source can be mounted and combined directly in the production process, so that the lamp manufacturer does not need to be mounted twice, which greatly simplifies the lamp production process. In addition, the LED chip body 21 in the LED light source 2 can be individually controlled through an external electrical connection. Compared with the side-type light guide technology, the light emitting device can smoothly achieve local light emission and local light extinction, and achieve high dynamic range display.

In some embodiments, referring to FIG. 10, the light emitting device of the present disclosure can further include a first diffusion layer 4 and a fluorescent powder layer 5, which can be stacked with each other, and the first diffusion layer 4 can be located between the transparent dielectric layer and the fluorescent powder layer 5. The fluorescent powder layer 5 can be produced on the first diffusion layer 4 by methods of coating, mold pressing or growing, and can be integrated with the first diffusion layer 4, or an independent sheet-shaped fluorescent powder layer, or a fluorescent powder layer having a supporting base of a transparent film. In the present embodiment, the transparent dielectric layer 3 cannot contain the fluorescent powder. The white light emitted by the light emitting device can be obtained by exciting the fluorescent powder layer 5 by a blue light emitted by the LED light source 2 (i.e., blue-light chip). Alternatively, the LED light source 2 can be a purple-light chip, and the white light can also be obtained by exciting the fluorescent powder layer 5 by a purple light. In the present embodiment, referring to FIG. 10, a second surface of the transparent dielectric layer 3 away from the substrate 1 is defined as an upper waveguide interface, i.e., the upper waveguide interface is the upper surface of the transparent dielectric layer 3. A second medium layer can be located at a surface of the upper waveguide interface away from the substrate, i.e., the second medium layer can be located above the upper surface of the transparent dielectric layer 3. The refractive index of the transparent dielectric layer can be defined as $n_2$, and the refractive index of the second medium layer can be defined as $n_3$, and the refractive index $n_2$ of the transparent dielectric layer is larger than the refractive index $n_3$ of the second medium layer.

In some embodiment, a second microstructure layer can be disposed at a side of the diffusion member near the transparent dielectric layer, the second microstructure layer can be irregular. A volume ratio of an area of the second microstructure layer and an area of the diffusion layer is in a range of 10:100 to 100:100. The second microstructure layer can be prepared by the following method: coating organic diffusion particles and a binding agent on the first diffusion layer 4 to define an irregular surface; alternatively, the irregular microstructure can be defined on the surface of the first diffusion layer 4 by the method of rolling pressing. The second microstructure of the first diffusion layer is tightly attached to the second microstructure to define a chamber. When the lower surface of the first diffusion layer 4 is attached to the upper waveguide interface of the high refractive index blue-light waveguide layer (i.e., transparent dielectric layer 3), an air gap can be defined, and the air gap can be the second medium layer.

Figure 19:
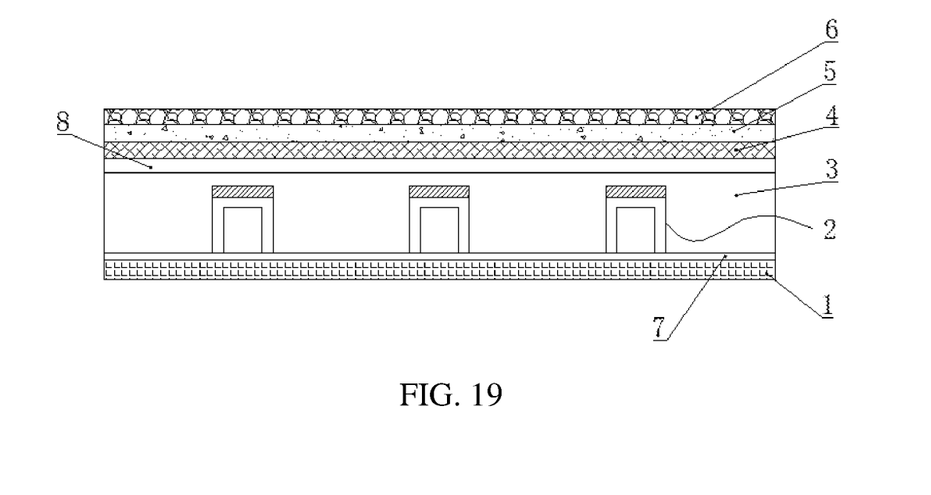
FIG. 19 is a structural schematic diagram of the light emitting device in another embodiment of the present disclosure.

In other embodiments, referring to FIG. 19, an air layer 8 can be disposed between the second surface of the transparent dielectric layer 3 and the first diffusion layer 4. At this time, the air layer 8 is the second medium layer.

The air gap and the air layer 8 can be a low refractive index layer. The blue light emitted by the LED light source 2 can form a waveguide in the high refractive index blue-light waveguide layer (i.e., the transparent dielectric layer 3). Refraction and reflection caused by fluorescent powder in normal structure can be reduced by high refractive index blue-light waveguide layer. At the same time, in a homogenous medium, attenuation of the blue light can be decreased in a large scale. Due to waveguide of light, the point light source can be changed into a surface light source, and this can increase lateral propagation of the blue light. At the same time, the light can distribute evenly in a medium layer having a low refractive index, and forming a white light by fluorescent excitation after transformed into the surface light source.

Figure 12:
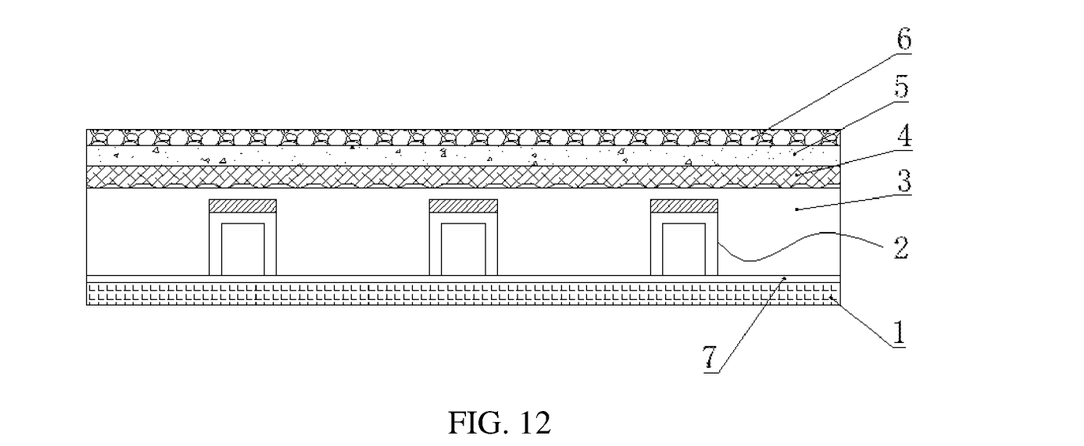
FIG. 12 is a structural schematic diagram of the light emitting device in another embodiment of the present disclosure.

In some embodiments, as shown in FIG. 10, FIG. 12 and FIG. 19, the light emitting device of the present disclosure can further include a second diffusion layer 6, which can be located at a first surface of the fluorescent powder layer 5 away from the transparent dielectric layer 3.

Figure 18:
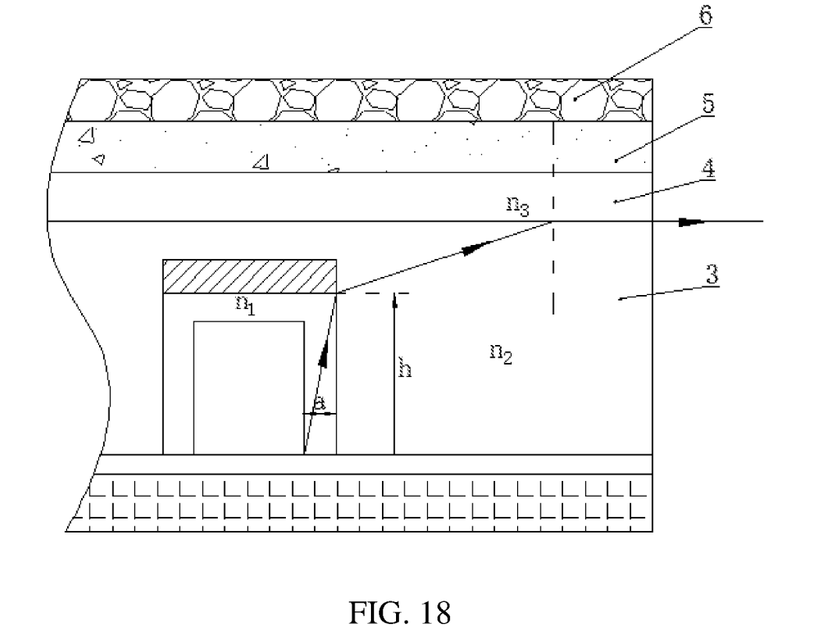
FIG. 18 is a partial enlarged view of the light emitting source in FIG. 18.

In some embodiments, when the LED light source 2 includes the first medium layer, referring to FIG. 18, a thickness of the first medium layer is defined as h, a size of a sidewall of the first medium layer along a direction perpendicular to the thickness of the first medium layer is defined as a, a refractive index of the first medium layer is defined as $n_1$, and the refractive index $n_1$ of the first medium layer, the refractive index $n_2$ of the transparent dielectric layer, and the refractive index $n_3$ of the second medium layer satisfy with the following formula:

$$\frac{h}{a} < \tan\left(\arcSin\frac{\sqrt{n_2^2 - n_3^2}}{n_1}\right)$$

When in application, the light emitting device of the present disclosure can be assembly with the liquid crystal module to produce a display.

The conventional liquid crystal display technology will be described hereinafter.

With the continuous development of liquid crystal display technology in commercial, industrial and military fields, LED backlight light sources have successfully replaced the traditional CCFL (cold cathode fluorescent lamp) due to their advantages of low power consumption, low heat generation, high brightness, high color reproduction, long service life, energy saving, environmental friendly and lightness, and etc.

Currently, the LED backlight modules commonly used in the industry can be mainly divided into two types: direct-type backlight and side-type backlight according to the position of the backlight source. According to types of LEDs, it can be divided into RGB LED and white LED. In a normal direct-type backlight, the LED light source is directly distributed behind the panel, and the light distribution is relatively uniform, but the cost is relatively high. Due to the need for lenses to achieve light mixing, the thickness of the product is relatively thick and it is impossible to produce an ultra-thin product. In the side-type backlight light source, the LED point light source is arranged on the surface of the light guide plate through corresponding design, and the light distribution is adjusted through the light guide plate. Therefore, the cost is low, and the thickness of the product can be reduced. The RGB LED backlight generally uses LEDs of the three primary colors (red, green and blue (RGB)) as independent light emitting elements. Compared with white LED backlight, RGB LED backlight has better brightness, contrast and saturation.

The widespread use of LED backlight modules has also promoted the continuous transformation and innovation of conventional display technologies. In addition to the original normal side-type LED backlight liquid crystal module and direct-type LED backlight liquid crystal module displays in the conventional display technology, there are also self-luminous displays that are booming in recent years. Therefore, there are many display products on the market, such as:

traditional side-type and direct-type LED liquid crystal displays, ULED, QLED, Mini-backlight, OLED, Mini-LED, etc. Furthermore, display devices having high color saturation, thinness, high dynamic range, and low cost have become mainstream trends that people continue to pursue.

Figure 20:
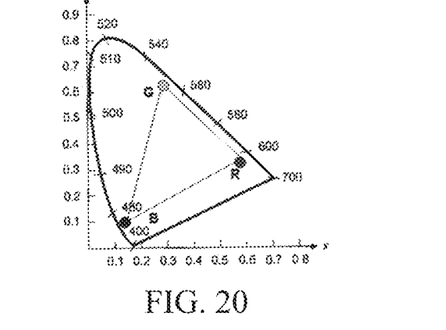
FIG. 20 is a color gamut view of three primary colors.
Figure 21:
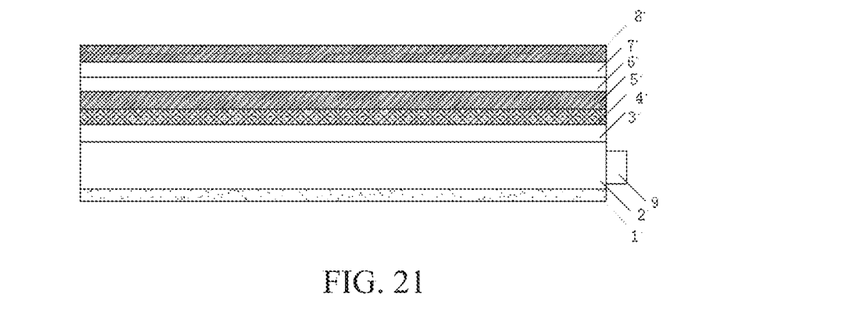
FIG. 21 is a structural schematic diagram of a side-type backlight unit in an embodiment of the present disclosure.

Firstly, referring to FIG. 20, the better the mono-chromaticity of the three primary colors, the closer the light emitting wavelength thereof to the edge in the color gamut diagram, the larger the area of the triangle enclosed. Therefore, the larger the color gamut area, the more colors the display can display, and the richer the colors that pictures and videos can show. The mono-chromaticity of LEDs is better than that of conventional OLEDs and conventional QLEDs, and the LEDs have the smallest luminous peak half-height width. Therefore, in general, the color gamut of the three primary color LEDs is relatively the widest.

Secondly, in order to obtain a more vivid color display effect, not only a wide color gamut is required, but also a high dynamic range (HDR) with a high actual brightness difference ratio is required (the ratio of the brightness of the brightest object to the brightness of the darkest object). Currently, only Mini-LED and OLED have a structure that is front self-luminous and do not require structures such as backlight modules and liquid crystal modules. Therefore, their HDRs are also the highest among all current displays, and theoretically having a. infinite ratio of the brightness and dark. Besides, it is currently more popular to adopt direct-type LED backlight modules, such as traditional direct-type backlight displays, ULED and Mini-backlight. However, they all require structures such as a backlight module and a liquid crystal module, and the presence of two polarizers in the module will cause some light loss. However, the direct-lit backlight can adopt local dimming, so as to obtain a higher HDR. The most commonly used side-type LED backlight modules, such as normal side-type LED backlight displays and QLED, also require structures such as backlight modules and liquid crystal modules. Not only there will be some light loss, but also the light guide plate is required to show the effect of uniform light output, resulting in low light conversion efficiency and light leakage. The above two factors cause much light loss, so HDRs thereof are relatively the lowest.

Finally, in order to obtain better monochromaticity and narrower half-width, traditional side-type and direct-type LED backlights and ULEDs usually use narrow-band filters. Although this can improve its monochromaticity and half-width, its luminous flux will also be greatly affected. Under normal circumstances, when the incident angle is positive or negative 20 degrees, the transmittance of the monochromatic narrowband filter can drop below 50%, while the transmittance of the monochromatic broadband filter is still 85%. Not only the light transmittance will seriously affect the luminous flux, it will also lead to its relatively poor HDR effect. In addition, the price of narrow-band filters is much higher than that of high-pass filters, and the cost is relatively high.

Figure 22:
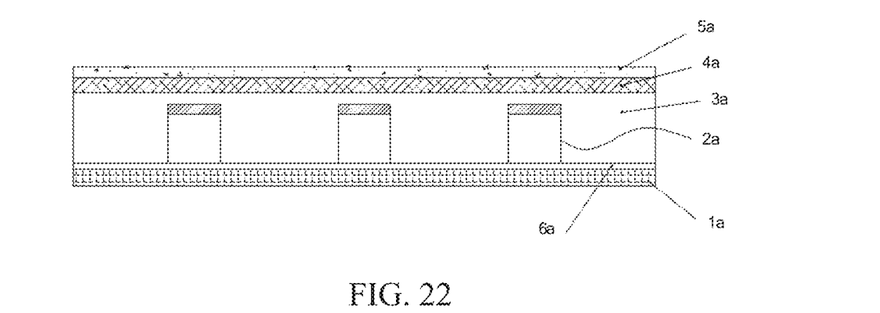
FIG. 22 is a structural schematic diagram of the light emitting device in another embodiment of the present disclosure.

In a normal LED liquid crystal display or QLED conventional side-type LED backlight module having, side-type LED backlight module is used. Referring to FIG. 22, the light emitting device can include a third reflecting layer 1', a light guide plate 2', a first diffusion layer 3', a bright enhancement film 4', a lower cross-polarization film 5', a liquid crystal module 6', a three-color light filter 7' and an upper cross-polarization film 8' from bottom to top. And an LED light source 9' can be disposed at a side surface of the light guide plate 2'. Although the product is thinner, its dynamic range is low, and the color gamut of normal side-type LED liquid crystal displays is lower. On this basis, QLEDs uses higher purity three-primary color quantum dots as down-conversion luminescent materials. Therefore, OLED has a high color gamut, and a higher price than that of normal side-type LED liquid crystal displays. However, quantum dots have the problem of poor chemical stability, so that the service life of QLED is shorter than that of normal side-type LED liquid crystal displays. For traditional direct-type backlight display having the direct-type LED backlight module, ULED and Mini-backlight do not require a light guide plate and have a long service life, but they all require an LCD module. Among them, the normal direct-type liquid crystal display still has the problem of low color gamut and dynamic range, and the product is very thick, but its service life is also long and the price is low. ULED has 576 LED light sources and a large-angle lenses, while adopting area extinction technology and software to obtain a higher dynamic range. However, ULED still has the problem of low color gamut, but its product thickness is relatively thick, the traditional direct display is thinner, and the price is relatively high. The Mini-backlight uses a large number of LED particles and high-density COB packaging to achieve uniform backlighting. It has a good color gamut, high dynamic range, and the product is relatively thin. However, because the distance between adjacent LEDs is only 2 mm, a large number of chips are required. The price is also relatively higher. Both OLED and Mini-LED, which rely on self-luminous display, do not require light guide plates and liquid crystal modules. Among them, OLED uses organic matter self-luminous array to emit relatively pure three primary colors, has a higher color gamut and dynamic range, and the product of which is thin. But the service life of OLED is short and its cost is high. Mini-LED directly uses three primary color LEDs, which have the purest color, the highest color gamut and high dynamic range, and the product is thinner. But Mini-LED also has the highest cost and is still in the research and development stage.

In view of the above, the conventional liquid crystal display technology should be further perfected and improved.

Figure 23:
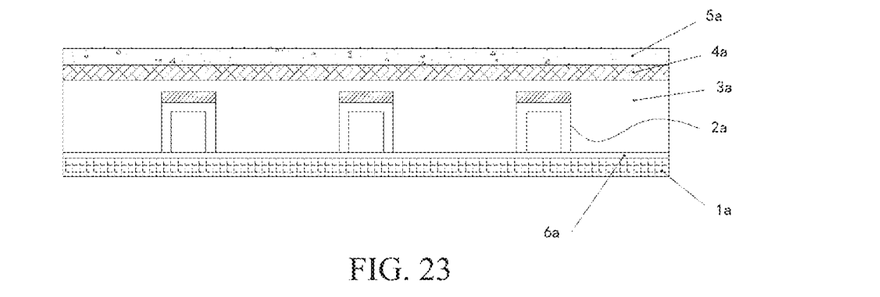
FIG. 23 is a structural schematic diagram of the light emitting device in another embodiment of the present disclosure.

When the light emitting device is assembled with a liquid crystal module to produce a display, as shown in FIG. 22 and FIG. 23, the LED light source 2a can be a red light source, a green light source and a blue light source. The light emitting device further can further include a first diffusion layer 4a and a liquid crystal module 5a having a broad-bandwidth high-pass light filter. The first diffusion layer 4a can be located between the transparent dielectric layer 3a and the liquid module 5a, and a refractive index of the transparent dielectric layer 3a can be larger than a refractive index of the lower surface of the first diffusion layer 4a.

In the LED backlight module display of the present disclosure, a three-color Mini backlight is provided, which directly adopts the three primary color LED light sources 2a and liquid crystal backlight module (LCM) 5a. Compared with conventional Mini-backlight technology, the blue light sources, green light sources and red light sources can emit light from four side surfaces. Therefore, the array distance can be greatly increased, and the number of LED light sources is greatly decreased. the LED backlight unit of the present disclosure has a high color gamut, high dynamic range (20000:1), using a broad-bandwidth light filter having a higher luminous flux, light and thin, flexible, lower price, and can produced in large scale in a mature liquid crystal production lines to achieve mass production.

In some embodiments, as shown in FIG. 22 and FIG. 23, a second microstructure layer is disposed at a lower surface side of the first diffusion layer 4a, and a ratio of an area of the second microstructure layer and an area of the first diffusion layer is in a range of 10:100 to 100:100. The second microstructure layer can be prepared by the following method: coating organic diffusion particles and a binding agent on the first diffusion layer 4a to define an irregular surface. Alternatively, the irregular microstructure can be defined on the surface of the first diffusion layer 4a by method of rolling pressing. Chambers can be defined in slots of the irregular surface, so as to define an air layer having a refractive index much lower than that of the transparent dielectric layer 3a.

In order to solve the problem of uneven light intensity and improve the light mixing effect, a first microstructure layer can be defined on the lower surface of the transparent dielectric layer 3a, or on the upper surface of the transparent dielectric layer 3a. The first microstructure layer can generally be arranged at a center of four adjacent LED light sources 2a arranging in an array.

In addition, in the present embodiment, a third reflecting layer 6a can be defined on the first surface of the substrate 1a near the transparent dielectric layer 3a. A structure of the LED light sources 2a can be the same as that of other embodiments, which is not repeated herein.

A method for preparing the light emitting device of the present disclosure will be further described hereinafter. Referring to FIG. 10, the method can include the following steps.

Step S101: placing a plurality of LED light sources 2 on a substrate 1, wherein each of the LED light sources includes of each of the plurality of LED light sources and light is able to emits from four sides of each of the plurality of LED light sources 2.

In some embodiments, the substrate 1 can be a flexible or rigid, transparent or non-transparent substrate. The substrate can be an integrated substrate, or a non-continuous substrate. That is, the substrate 1 can be a plurality of discontinuous strip-shaped substrate disposed at intervals, and the strip-shaped substrates can be connected with each other via a plate electrode at one or two ends thereof.

When the substrate 1 is the integrated substrate, the step S101 can include the following steps: providing an integrated substrate 1; plating a third reflecting layer on a surface of the substrate 1 according to need; and entirely placing the chip on the surface of the substrate 1, i.e., placing LED light sources 2 having four light emitting surfaces on the substrate 1.

When the substrate 1 is the non-continuous substrate, the step 101 can include the following steps: providing an integrated substrate 1; plating a third reflecting layer on a surface of the substrate 1 according to need; and entirely placing the chip on the surface of the substrate 1, i.e., placing LED light sources 2 having four light emitting surfaces on the substrate 1; then cutting the substrate 1 into strip-shaped substrates having a width in a range of 0.2 mm to 3 mm, and one or two ends of each strip-shaped substrates can be connected together via an electrode plate or an electrode assembly to form an integrated structure.

In some embodiments, the present disclosure can further include a step of producing a LED light source 2 having four light emitting surfaces before the step S101. The step can include the following steps.

Step S1, selecting a plurality of LED chip bodies 21, each of which includes a third reflecting layer 211, a P—GaN layer 212, a light emitting layer 213, a N—GaN layer 214 and a base 215, and the third reflecting layer 211, the P—GaN layer 212, the light emitting layer 213, the N—GaN layer 214 and the base 215 are disposed from bottom to top.

S2, equidistantly arranging the plurality of LED chip bodies to form a first gap between adjacent two of the plurality of LED chips, disposing a first medium layer 23 on the plurality of LED chip bodies and in the first gap, and obtaining a semi-finished product.

S3, baking the semi-finished product obtained in S2 to semi-solidify the semi-finished product, and disposing a first reflecting layer 22 at a top surface of the semi-manufactured product.

S4, baking and solidifying the whole round chip, and then cutting and splitting, and testing the chip, sorting and rearranging to obtain the LED light source 2 having a first medium layer 23 and a first reflecting layer 22, and the LED light source 2 can emit light from four side surfaces.

Step S102: placing the substrate 1 on the supporting base, wherein a surface the substrate 1 without the plurality of LED light sources 2 can be in contact with the supporting base.

In some embodiments, the supporting base can be a reusable module or backlight plate. The continuous substrate 1 can be disposed on the reusable module or backlight plate.

S103: forming a transparent dielectric layer 3 on the supporting plate and the transparent dielectric layer 3 can cover the plurality of LED light sources 2.

In some embodiments, a transparent material having a high refractive index can be coated on the whole supporting base, such as silica gel or arcylic. Therefore, the transparent having high refractive index can be covered on a surface of the whole continuous substrate 1, and can be entirely subjected to mold pressing, so as to define the transparent dielectric layer 3 of the LED 2 having four light emitting side surfaces.

Step S104: peeling off a light emitting device from the supporting base.

When the light emitting device has a structure as shown in FIG. 10, the method of the present disclosure further comprising the following steps before the step S104: successively forming a diffusion layer 4 and a fluorescent powder layer 5 on an upper surface of the transparent dielectric layer 3, so as to form a blue waveguide light emitting structure having four light emitting side surfaces.

When the light emitting device has a structure as shown in FIG. 11, the method of the present disclosure further includes the following step before the step S104: successively forming a diffusion layer 4a and a liquid crystal module 5a having a broad-bandwidth high-pass light filter on an upper surface of the transparent dielectric layer 3a.

A backlight module including the light emitting device of the present disclosure is compared with conventional direct-type backlight modules, and the data will be shown in Table 1. Therein, a structure of the LED light source in the light emitting device is shown in FIG. 13.

TABLE 1

6-inch mobile phone backlight application

Figure 6:
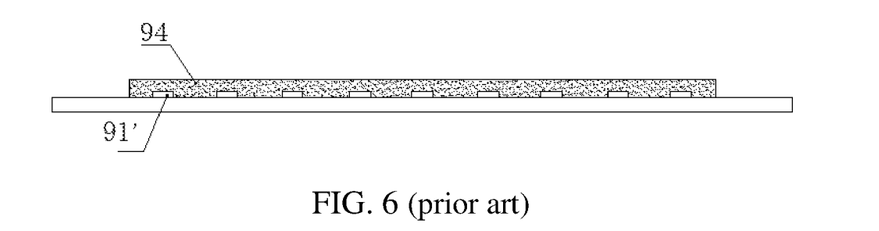
FIG. 6 is a schematic diagram illustrating light intensity superposition principle of another conventional direct-type surface light source display module including an LED light source array and a fluorescent powder dielectric layer.

| | Light emitting region | Main energy angle of a main | Light emitting angel | Thickness of panel lamp | Distance between adjacent two LED light sources | Number of LED light sources |
|---|---|---|---|---|---|---|
| Surface light source module including LED light source of FIG. 13 (having the light excitation layer and without first transparent dielectric layer) | 132.48 mm * 74.52 mm | +60° and −60° | 170° | 1 mm | 6 mm | 241 |
| COB(FIG 6) | 132.48 mm * 74.52 mm | 0° (straight up direction) | 120° | 1 mm | 2 mm | 2416 |

It can be seen from Table 1 that, under the premise that the light emitting area have the same area and the backlight modules have the same thickness, the LED light source in the present embodiment has four light emitting sides and a large light emission angle. The main light emission energy direction is shifted from a straight up direction to a side direction. Meanwhile, the light emission angle is up to 170 degrees or more. Meanwhile, under the premise of ensuring the same light mixing effect, a distance between adjacent two LED light source 2 is effectively improved, substantially reducing the number of LED light sources.

When the light emitting device include a liquid crystal module 5a, the display of the LED backlight module of the present disclosure is compared with conventional displays, and the data will be shown in Table 2.

TABLE 2

Comparison of a display of LED backlight module in the present disclosure and conventional displays

| Display type | Character of the BLU | Light-guide plate | LCM | Color gamut | Dynamic range | Thickness | Service life | Price |
|---|---|---|---|---|---|---|---|---|
| Normal side-type LED liquid crystal module | Normal side-type LED liquid crustal | Y | Y | Low color gamut | Low dynamic range | A little thin | Long | Low |
| Normal direct-type LED liquid crystal module | LED light source + large-angle lenses | N | Y | Low color gamut | Low dynamic range | Very thick | Long | Low |
| ULED direct-type + software | 576 LED light sources + large-angle lenses + local dimming technology | N | Y | Low color gamut | Higher dynamic range | Moderately thick | Long | Lower |
| QLED | higher purity three-primary color quantum dots as down-conversion luminescent materials | Y | Y | High color gamut | Low dynamic range | A little thin | Poor quantum dots stability, and short service life | Middle |
| Mini-backlight + software | high-density COB packaging (the distance is 2 mm) | N | Y | Middle color gamut | High dynamic range | Thinner | Short | Higher |
| OLED | organic matter self-luminous arrayto emit relatively pure three primary colors | N | N | Higher color gamut | Highest dynamic range | Very thin | Relatively long | Higher |
| Mini-LED | three primary color LEDs | N | N | Highest color gamut | Highest dynamic range | Thinner | Long | Highest |

TABLE 2-continued

Comparison of a display of LED backlight module in the present disclosure and conventional displays

| Display type | Character of the BLU | Light-guide plate | LCM | Color gamut | Dynamic range | Thickness | Service life | Price |
|---|---|---|---|---|---|---|---|---|
| three color mini-backlight of the present disclosure | three primary color LEDs | N | Y, broad bandwidth high-pass light filter | Highest color gamut | Highest dynamic range | Thinner | Long | Middle |

Comments: "Y" represents that the display has a relevant element, and "N" represents that the display does not have the relevant element.

Compared with the traditional display, it can be concluded from Table 2 that the display comprising the LED backlight unit of the present disclosure has a high color gamut, high dynamic range (20000:1), using a broad-bandwidth light filter having a higher luminous flux, light and thin, flexible, lower price, and can produced in large scale in a mature liquid crystal production lines to achieve mass production.

What is claimed is:

1. A light emitting device, comprising
   a substrate;
   a plurality of LED light sources disposed on the substrate at intervals, wherein each of the plurality of LED light source has a first reflecting layer on a top surface of each of the plurality of LED light source and light is able to emit from four sides of each of the plurality of LED light source; and
   a transparent dielectric layer, which is disposed on a first surface of the substrate and covers the plurality of LED light sources.

2. The light emitting device of claim 1, wherein each of the plurality of LED light source comprises an LED chip body and the first reflecting layer covering on a top surface of the LED chip body.

3. The light emitting device of claim 2, wherein the LED light source further comprises a first medium layer, which is located on the top surface and side surfaces of the LED chip body, and the first reflecting layer is located at a top surface of the first medium layer.

4. The light emitting device of claim 3, wherein a refractive index of the first medium layer is greater than or equal to a refractive index of the transparent dielectric layer.

5. The light emitting device of claim 3, wherein the LED light source further comprises a second reflecting layer located between the top surface of the LED chip body and the first medium layer, and the second reflecting layer is a totally reflecting layer or a partially reflecting layer.

6. The light emitting device of claim 1, wherein the transparent dielectric layer is a dielectric layer made of a homogeneous material.

7. The light emitting device of claim 1, further comprising a first microstructure layer, which is located on a first surface of the substrate near the transparent dielectric layer; and/or, located on a first surface of the transparent dielectric layer near the substrate, and or located on a second surface of the transparent dielectric layer away from the substrate.

8. The light emitting device of claim 4, further comprising a waveguide reflecting layer, which is located between the transparent dielectric layer and the substrate.

9. The light emitting device of claim 3, further comprising a first diffusion layer, which is located at the second surface of the transparent medium away from the substrate, and an air layer or an air gap is located between the first diffusion layer and the transparent dielectric layer.

10. The light emitting device of claim 9, wherein
   when the air gap is disposed between the diffusion layer and the transparent dielectric layer, a second microstructure layer is disposed at a side of the diffusion member near the transparent dielectric layer, and a ratio of an area of the second microstructure layer and an area of the first diffusion layer is in a range of 10:100 to 100:100; and the second microstructure of the diffusion layer is tightly attached to the second microstructure to define the air gap.

11. The light emitting device of claim 9, wherein when the air layer or the air gap is formed between the diffusion layer and the transparent waveguide layer, the air layer or the air gap is defined as a second medium layer,
   a refractive index of the second medium layer is defined as $n_3$, the refractive index of the transparent dielectric layer is defined as $n_2$, and the refractive index $n_2$ of the transparent dielectric layer is larger than the refractive index $n_3$ of the second medium layer.

12. The light emitting layer of claim 11, wherein
   a thickness of the first medium layer is defined as h, a size of a sidewall of the first medium layer along a direction perpendicular to the thickness of the first medium layer is defined as a, a refractive index of the first medium layer is defined as $n_1$, and the refractive index $n_1$ of the first medium layer, the refractive index $n_2$ of the transparent dielectric layer, and the refractive index $n_3$ of the second medium layer satisfies the formula:

$$\frac{h}{a} < \tan\left(\arcSin\frac{\sqrt{n_2^2 - n_3^2}}{n_1}\right).$$

13. The light emitting device of claim 9, wherein the LED light source is a blue light source, and the transparent dielectric layer is a blue-light waveguide layer; and the light emitting device further comprises a fluorescent powder layer, which is stacked with the first diffusion layer, and the first diffusion layer is located between the transparent dielectric layer and the fluorescent powder layer.

14. The light emitting device of claim 13, further comprising a second diffusion layer, which is located at a first surface of the fluorescent powder layer away from the transparent dielectric layer.

15. The light emitting device of claim 13, wherein the fluorescent powder layer comprises a transparent film and fluorescent powder located on the transparent film.

16. The light emitting device of claim 9, wherein the LED light source is a red light source, green light source or a blue light source, and the light emitting device further comprises a liquid crystal module having a broad-bandwidth high-pass light filter, which is stacked with the first diffusion layer, and the first diffusion layer is located between the transparent dielectric layer and the liquid crystal module, and the refractive index of the transparent dielectric layer is larger than a refractive index of a lower surface of the diffusion layer.

17. The light emitting device of claim 2, wherein the LED chip body comprises a third reflecting layer, a P—GaN layer, a light emitting layer, a N—GaN layer and a base, wherein the third reflecting layer, the P—GaN layer, the light emitting layer, the N—GaN layer and the base are disposed from bottom to top, the first reflecting layer covers the LED chip body.

18. The light emitting device of claim 1, wherein the substrate is a plurality of discontinuous strip-shaped plates disposed at intervals, and the LED light source is disposed on the discontinuous strip-shaped plates.

19. A method for preparing a light emitting device, comprising:
  placing a plurality of LED light sources on a substrate, wherein each of the plurality of LED light sources comprises a first reflecting layer on a top surface of each of the plurality of LED light sources and light is able to emits from four sides of each of the plurality of LED light sources;
  disposing the substrate on a supporting base, wherein a second surface of the substrate without the plurality of the LED light sources is in contact with the supporting base;
  forming the transparent dielectric layer on the supporting base, wherein the transparent dielectric layer covers the plurality of the LED light sources; and
  peeling off a light emitting device from the supporting base.

20. The method of claim 19, wherein before a step of placing the plurality of LED light sources, further comprising:
  S1, selecting a plurality of LED chip bodies, each of which comprises a third reflecting layer, a P—GaN layer, a light emitting layer, a N—GaN layer and a base, and the third reflecting layer, the P—GaN layer, the light emitting layer, the N—GaN layer and the base are disposed from bottom to top;
  S2, equidistantly arranging the plurality of LED chip bodies to form a first gap between adjacent two of the plurality of LED chips, disposing a second medium layer on the plurality of LED chips and in the first gap, and baking to obtain a semi-finished product;
  S3, disposing a first reflecting layer at a top surface of the semi-manufactured product; and
  S4, baking and solidifying the semi-finished product having the first reflecting layer, and then cutting, splitting and testing the chip, sorting and rearranging to obtain the LED light source.

\* \* \* \* \*